(12) United States Patent
Puchner et al.

(10) Patent No.: US 6,727,165 B1
(45) Date of Patent: Apr. 27, 2004

(54) FABRICATION OF METAL CONTACTS FOR DEEP-SUBMICRON TECHNOLOGIES

(75) Inventors: Helmut Puchner, Santa Clara, CA (US); Ming-Yi Lee, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 91 days.

(21) Appl. No.: 09/967,074

(22) Filed: Sep. 28, 2001

(51) Int. Cl.[7] ............................................... H01L 21/44
(52) U.S. Cl. ........................ 438/581; 438/571; 438/301; 438/374; 438/515
(58) Field of Search ............................... 438/581, 570, 438/571, 301, 514, 515

(56) References Cited

U.S. PATENT DOCUMENTS

| | | | | |
|---|---|---|---|---|
| 5,481,124 A | * | 1/1996 | Kozuka et al. | |
| 5,858,849 A | * | 1/1999 | Chen | |
| 6,100,191 A | * | 8/2000 | Lin et al. | |
| 6,110,821 A | * | 8/2000 | Kohara et al. | |
| 6,258,682 B1 | * | 7/2001 | Tseng | |
| 6,271,592 B1 | * | 8/2001 | Kim et al. | |
| 6,281,087 B1 | * | 8/2001 | Tseng | |
| 6,284,653 B1 | * | 9/2001 | Tseng | |

* cited by examiner

*Primary Examiner*—Long Pham
(74) *Attorney, Agent, or Firm*—Beyer, Weaver & Thomas

(57) ABSTRACT

Provided is a process for forming a semiconductor device having salicided contacts. A concentration of metal is formed at the substrate surface by exposing the substrate to a metal plasma. The concentration of metal is then annealed to produce a salicided contact. In a separate embodiment, the metallization plasma and salicide anneal occur in-situ in one process step.

22 Claims, 2 Drawing Sheets

FABRICATION OF METAL CONTACTS FOR DEEP-SUBMICRON TECHNOLOGIES

BACKGROUND OF THE INVENTION

1. Field of the Invention

The present invention relates to techniques for forming semiconductor devices having salicided metal contacts.

2. Description of the Related Art

As scaling continues to occur in the semiconductor industry, the corresponding reduction in junction depths makes it more difficult to reliably form salicided contacts. In conventional CMOS processing, self-aligned silicided ("salicided") metal contacts are initially formed on silicon substrates by depositing cobalt, titanium or other metals and then annealing. Silicides, such as tungsten silicide ($WSi_2$), titanium silicide ($TiSi_2$), and cobalt silicide ($CoSi_2$) are used in the semiconductor industry to enhance signal propagation through MOS transistors and other conductive features of semiconductor devices. A conventional silicide process produces a silicide region on the top of an MOS transistor's polysilicon ("poly") gate electrode and interconnect. The silicide has a lower resistance than the underlying doped silicon or poly. As a result, signal propagation through the transistor (gate and interconnect) is enhanced. The deposited metal layer is conventionally capped with a TiN or Ti protective layer to prevent oxidation of the metal.

The metal contacts are later salicided in the conventional process by subjecting the wafer to the high temperatures of an annealing process such as rapid thermal annealing. But the process typically consumes significant portions of the silicon substrate in order to form the silicided metal. The depth of the silicon consumed in the salicidation process is determined by the salicidation mechanism between the metal and the silicon substrate. Some metal based silicides such as NiSi offer low silicon consumption but suffer from agglomeration and early nucleation to the highly resistive $NiSi_2$ phase at temperatures as low as 650° C.

Moreover, salicide spikes may shorten the junctions. The traditional metal film process involves depositing the metal using a traditional physical vapor deposition (PVD) process. The silicidation process enables nonuniformities in the surface of the substrate to form spikes as the silicide is grown in a thermal environment. With sufficient depth in the junction, these thermal spikes caused by the substrate surface nonuniformities do not significantly affect the junction operation. However, as the junction becomes ultra shallow to meet the scaling requirements of future miniaturized CMOS technologies, these thermal salicide spikes may shorten the junction and destroy the operation of the device.

Accordingly, it is desirable to reliably produce a thin silicided contact without forming large spikes in the substrate. It is desirable to avoid these spikes especially with shallow junctions to assure reliable operation of the junction.

SUMMARY OF THE INVENTION

To achieve the foregoing, the present invention provides a process for forming a semiconductor device having salicided contacts. A concentration of metal is formed in a surface region of a silicon substrate by exposing the substrate to a metal plasma. The concentration of metal is then annealed to produce a salicided contact. The incorporation of the metal ions into the substrate provides greater control over the thickness of the metal contact and provides a salicided contact with smaller nonuniformities than conventional salicide formation methods.

In one aspect, the invention provides a method of forming a semiconductor device having salicided contacts. A concentration of metal is formed at the silicon substrate surface of a partially formed semiconductor device by exposing the substrate to a metal plasma. Salicided contacts are formed by annealing the concentration of metal at the substrate surface. A barrier cap is formed on the formed concentration of metal. The annealing step occurs in a separate step after the substrate is exposed to the metal plasma.

In another aspect, a concentration of metal is formed at the silicon substrate surface of a partially formed semiconductor device by exposing the substrate to a metal plasma. Salicided contacts are formed by annealing the concentration of metal at the substrate surface. A barrier cap is formed on the formed concentration of metal by using plasma doping equipment.

In yet another aspect, annealing the concentration of metal at the silicon substrate surface is an in-situ step occurring simultaneously with exposing the substrate to a metal plasma. The substrate is heated to a preselected temperature simultaneously with the metallization plasma without the need for a separate annealing step.

These and other features and advantages of the present invention are described below with reference to the drawings.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides a process for forming a semiconductor device having salicided contacts. A concentration of metal is formed at a silicon substrate surface by exposing the substrate to a metal plasma. The metal plasma ions are implanted into the surface region of the substrate at a low energy. The concentration of metal is then annealed to produce a salicided contact. The implantation of the metal ions into the substrate provides greater control over the thickness of the metal contact and provides a salicided contact with smaller nonuniformities than conventional salicide formation methods.

Figure 1A:
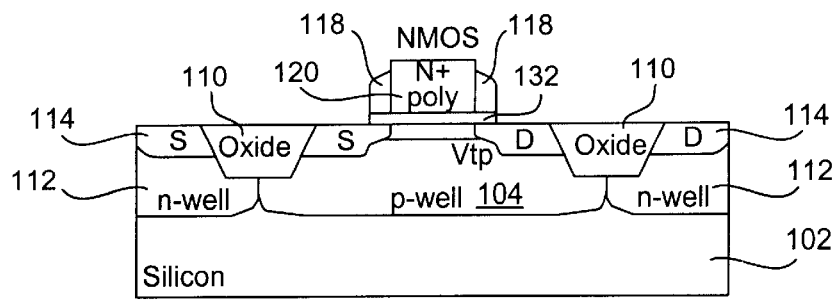
FIGS. 1a–1e depict stages in the method of forming a semiconductor device having a salicided contact in accordance with one embodiment of the present invention.

FIGS. 1a–1e depict stages in the method of forming a semiconductor device having a salicided contact in accordance with one embodiment of the present invention. The process commences, as illustrated in FIG. 1a, by using conventional CMOS technology to dope a silicon substrate 102 to form a p-well 104, source region 106, drain region 108, separated by field oxidation regions 110 from the n-wells 112 and source/drain regions 114 of the adjacent active devices. The gate oxide stack comprising the gate oxide 116, sidewall spacers 118, and poly contact 120 are likewise formed by conventional CMOS processing methods, typically involving patterning and etching steps as is known to those of skill in the art. A cleaning step (not shown) may be necessary to remove residual or protection layers prior to further steps in the formation of the metal contacts.

Figure 1B:
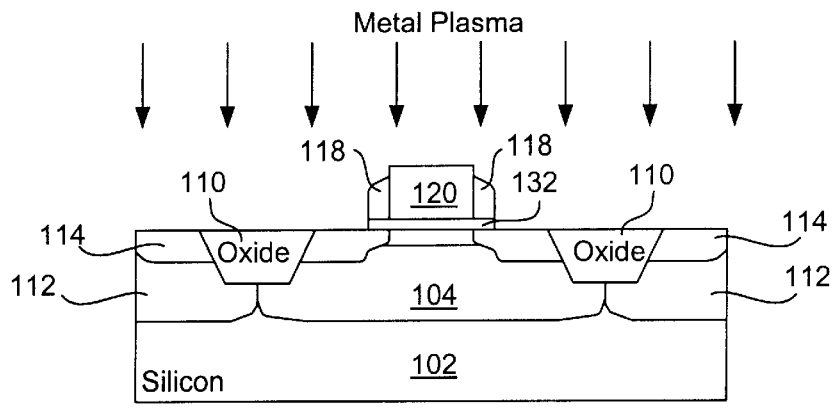

As illustrated in FIG. 1b, a partially fabricated semiconductor device is subjected to a metal plasma. The exposure of silicon substrate 102 to the metal plasma may be carried out at room temperature, i.e., at a temperature ranging from about 15° C. to about 30° C., and preferably about 20° C. to about 27° C., although higher temperatures may be used, if desired. A pressure ranging from about 0 milliTorr (mTorr) to about 100 mTorr has been found to be satisfactory, with a preferable pressure of 10 milliTorr (mTorr).

The energy or power level of the metal plasma should be sufficient to permit the metal atoms to penetrate into silicon substrate 102, but insufficient to result in any discernible sputtering of silicon atoms from the surface of silicon substrate 102. Suitable power sources fall within the range of about 1 kw to 10 kw for a DC power source, and about 1 kw to 10 kw for an RF power and may be varied within these ranges to optimize the metal plasma deposition. DC power values of 2250 watts and RF power levels of 2750 watts are typical. Preferably the wafer bias will be set at 5 w with suitable values falling in the range of 0 to 20 watts.

Figure 1C:
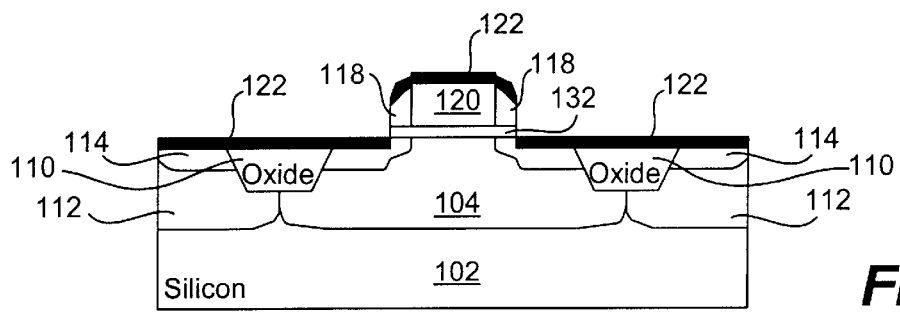

A variety of suitable equipment for generation of the plasma is available. The AMAT Endura IMP chamber is one typical example. The plasma source injects the metal into the doped silicon substrate to produce a uniform, thin metal layer 122 as illustrated in FIG. 1c. The flux of the metal plasma, i.e. the rate at which the metal is formed in the substrate, may be adjusted by altering the process parameters. For example, DC power, RF power, pressure, and wafer bias voltage may be adjusted to alter the flux. In particular, the wafer bias voltage may be adjusted to avoid sputtering of silicon from the substrate surface, thus providing a metal of uniform thickness and a minimization of substrate surface defects. Suitable values for the flux range from $1*10^{10}$ atoms*cm$^{-2}$*sec.$^{-1}$ to $1*10^{16}$ atoms*cm$^{-2}$*sec.$^{-1}$. Metals used to form the plasma generated metal layer 122 include titanium, cobalt, nickel, platinum, palladium and iridium. Using the range of parameters identified above results in typical values for metal ion flux for titanium at about $6*10^{15}$ atoms*cm$^{-2}$*sec.$^{-1}$. At this flux, for example, 15 nm of titanium may be incorporated into the surface of the silicon substrate in about 12.5 sec. Typical values for the cobalt ion flux are about $1*10^{15}$ atoms*cm$^{-2}$*sec.$^{-1}$.

Figure 1D:
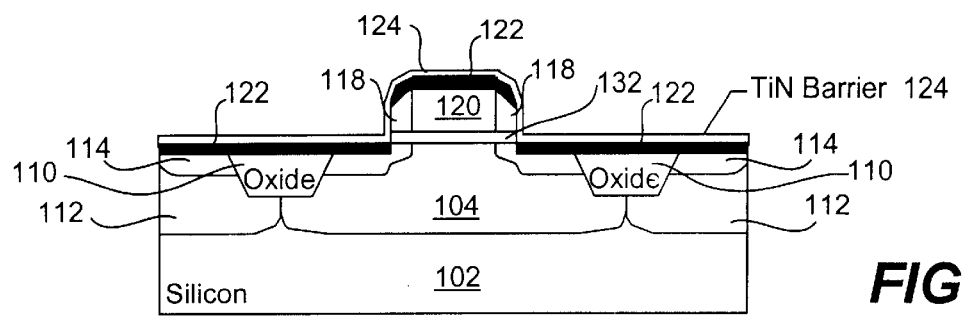
Figure 1E:
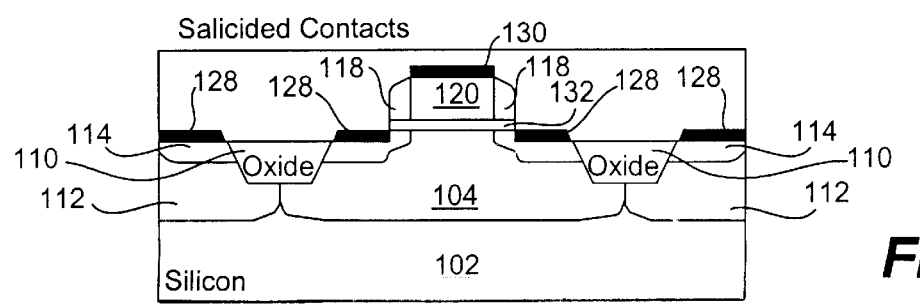

The concentration of the metal incorporated into the surface region of the silicon substrate maybe controlled by the time of exposure to the plasma. Metal ions incorporated into the substrate from the plasma source are placed in a directional manner, thus there is no deposition of metal ions on the spacer sidewalls 118. Thus, this process is advantageous over conventional deposition methods in eliminating a possible leakage path through the spacer sidewalls 118. As illustrated in FIG. 1d, a capping barrier later 124 such as TiN or Ti is next deposited over the substrate incorporated metal ion layer to protect the metal layer during subsequent operations. This capping layer may be deposited on top of the structure using conventional physical vapor deposition (PVD) steps or by using plasma doping equipment. A high concentration of the nitride barrier layer is desirable and may be formed by using a lower bias power in comparison to the bias power levels used to incorporate the metal ions into the substrate. The capping layer 124 functions to protect the deposited or implanted metal layer during the subsequent annealing operation from oxidation.

The plasma metal ions incorporated into the substrate surface region present a highly resistive contact. As with the conventional CMOS formation methods, the metal must be converted into a silicide in order to generate a low ohmic contact. The structure is subjected to a rapid thermal annealing step (not shown) so that the metal ions form a salicide (self-aligned silicide) layer with the neighboring silicon atoms. For example, a rapid thermal anneal may be performed by heating the substrate 102 to about 400 to 950° C. for a period of about 15 to 90 seconds. The heating process helps to form a low resitivity silicide phase. The anneal temperature and time depend on the material phase transformation. Both TiSi2 and CoSi2 require two rapid thermal annealing steps separated by the selective etch step. For example, an RTA1 (rapid thermal anneal 1) process may be suitably be performed to form TiSi2 at a temperature range of 750 to 850° C. The RTA2 step, after etching, may be suitable performed in the range of 800 to 950° C. A suitable temperature for the silicidation of CoSi2 falls within the range of 400 to 560° C. for the RTA1 step and 700 to 850° C. for the RTA2 step. A suitable RTA1 temperature range for the formation of NiSi falls within the range of 350 to 460° C. The RTA2 step is optional for NiSi but could be performed suitably in the temperature range of 450 to 500° C. Generally, the RTA steps will involve a temperature exposure ranging from 15 to 90 sec., with the lower temperatures in the ranges requiring exposure periods at the upper end of the time range and higher temperatures requiring exposures at the lower end of the time range. Both the plasma conditions and the annealing conditions determine the depth of the salicided layer.

The self-aligned contacts are formed finally by a selective etch step. The selective etching is well known to those of skill in the art and selectively etches the capping and non-silicided metal layers, i.e. those layers which have not formed a silicide compound in the annealing step. Following the selective etching, only the salicided contacts remain, e.g., source and drain contacts 128 and gate contact 130.

As noted above, certain silicides, e.g. TiSi2 and CoSi2, undergo an additional RTA2 process after the selective etching to produce a more uniform phase in the silicide. The device is completed using standard CMOS technology for passivation and reflow, with the final device structure with silicided contacts illustrated in FIG. 1e.

The controllable flux of the metal plasma permits the salicide layer to be formed in-situ during the exposure of the substrate to the metal plasma, thus reducing the number of process steps. This is accomplished by heating the wafer chuck to allow the immediate formation of salicide material during the plasma metallization.

Figure 2A:
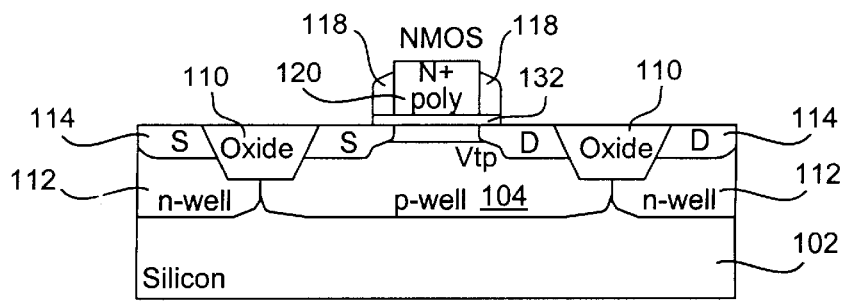
FIGS. 2a–2d depict stages in the method of forming a semiconductor device having a salicided contact in accordance with another embodiment of the present invention.

FIGS. 2a–2d depict stages in the method of forming a semiconductor device having a salicided contact in-situ in accordance with another embodiment of the present invention. The process commences, as illustrated in FIG. 2a, by using conventional CMOS technology to dope a silicon substrate 102 with a p-well 104 source region 106, drain region 108, separated by field oxidation regions 110 from the n-wells 112 and source/drain regions 114 of the adjacent active devices. The gate oxide stack comprising the gate oxide 116, sidewall spacers 118, and poly contact 120 are likewise formed by conventional CMOS processing methods, typically involving patterning and etching steps. A cleaning step (not shown) may be necessary to remove residual or protection layers and to provide a clean silicon surface where the contacts should be grown. In this pathway, the silicon substrate surface 102 is exposed to a metal plasma simultaneously with an annealing step.

Figure 2B:
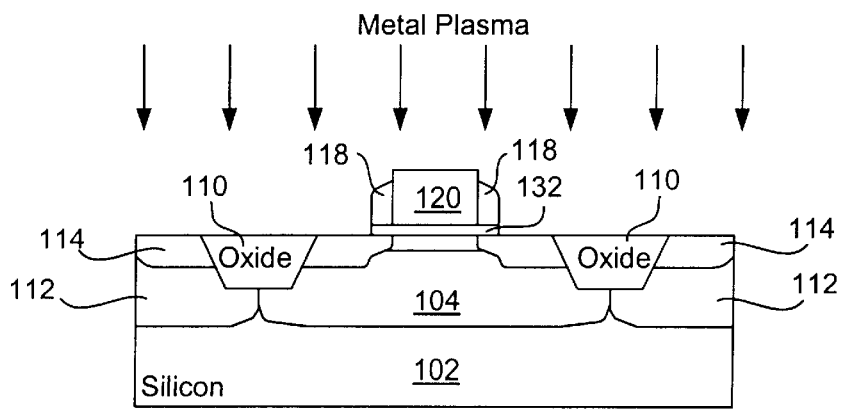

As illustrated in FIG. 2b, the partially formed device is exposed to the metal plasma, typically by equipment such as an AMAT Endura IMP chamber. As in the first pathway described above, the flux of the metal plasma may be adjusted by altering any of the DC power, RF power, pressure and wafer bias voltage. Suitable values for the flux range from $1*10^{10}$ atoms*$cm^{-2}$*$sec.^{-1}$ to $1*10^{16}$ atoms*$cm^{-2}$*$sec.^{-1}$. The wafer chuck may be simultaneously heated while the substrate 102 is exposed to the plasma, in the IMP chamber described above.

The wafer temperature will be selected in cognizance of the flux but primarily based on the metal used to form the contacts. The wafer temperature may be controlled using a heating and cooling chuck. The temperature is selected to allow each ion layer formed by the metal plasma to convert to the proper phase (the desired silicide) prior to the arrival of the next layer of metal ions. For example, in order to form a NiSi silicide, a temperature range of 250° C. to 650° C. is suitable. Temperature ranges of 750° C. to 950° C. are suitable for the formation of $TiSi_2$. A typical value for the Ti metal ion flux is $6*10^{15}$ atoms*$cm^{-2}$*$sec.^{-1}$. Temperature ranges of 500° C. to 850° C. are suitable for the formation of $CoSi_2$, with a typical metal ion flux for the Co at $1*10^{15}$ atoms*$cm^{-2}$*$sec.^{-1}$.

Figure 2C:
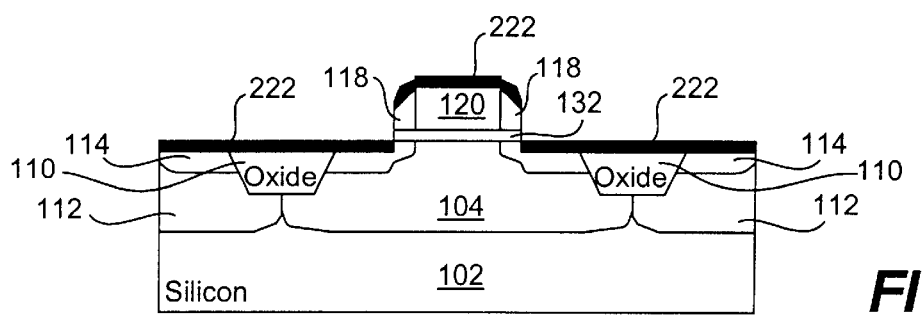
Figure 2D:
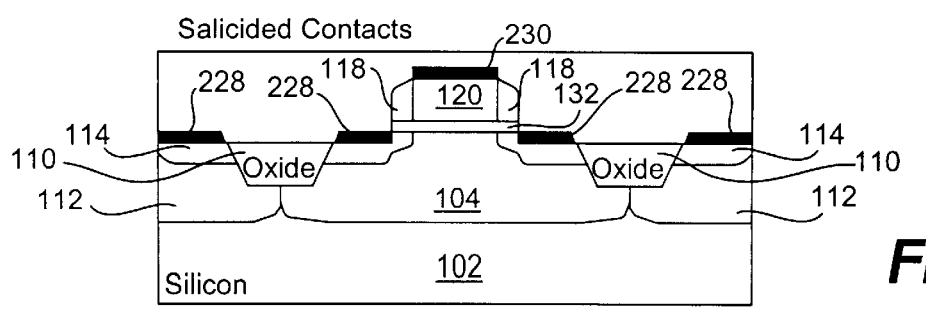

This in-situ process forms salicided contacts 228,230 in one step, without removing the wafer from the plasma chamber and subjecting it to a subsequent annealing process, as illustrated in FIG. 2c.

Again, as in the conventional salicide process, the metal ions deposited on the oxide must be removed using a selective etch process, using chemicals well known to those of skill in the art. The etching selectively removes the metal ions deposited on the field oxides 110 and tops of sidewall spacers 118, thus leaving the salicided source and drain contacts 228 and the salicided gate contact 230 with the device structure with silicided contacts illustrated in FIG. 2d. An optional RTA process step may be performed (not shown) after the selective etch step to improve material phase transformation and reduce leakage current. The device is completed using standard CMOS technology for passivation and reflow.

The metal plasma doping and separate annealing step embodiment as well as the in-situ process described above provide many advantages over conventional methods. Exposing the substrate to a metal plasma permits a uniform layer of metal to be deposited in a surface region of the substrate, as thin as 1 nm. This controllably thin layer avoids undue consumption of the silicon during silicidation. Moreover, the concentration of metal may be incorporated into the substrate beneath any surface defects or other nonuniformities in the substrate. Thus, during silicidation, the growth of thermal spikes are minimized. This avoids shortening of the junction which is a problem predicted for the ultra-shallow junctions produced in further miniaturization of semiconductor devices. In addition, the process is rapid. For example, 15 nm of titanium may be incorporated into the silicon surface in about 12.5 seconds using the process parameters ranges described above.

The techniques described in the embodiments of the invention are applicable to the formation of salicided contacts in all MOS devices including NMOS, PMOS and CMOS as well as the formation of bipolar devices. They are particularly useful for process technologies below 90 nm and may be used to produce salicide contact thicknesses down to about 1 nm. As these device sizes shrink, the use of high-k dielectrics such as a gate dielectric 132 (as illustrated in FIGS. 1a–1e and 2a–2d) is expected to be more prevalent in lieu of traditional SiO2 gate oxides. These high-k dielectrics retain the desirable electrical characteristics for small devices while permitting a thicker dielectric layer to be deposited, thus avoiding unwanted electrical leakage. Thus the combined use of the plasma metallization described herein and the high-k dielectrics will avoid many of the problems associated with device miniaturization.

Although the foregoing invention has been described in some detail for purposes of clarity of understanding, it will be apparent that certain changes and modifications may be practiced within the scope of the appended claims. For example, the process of the present invention is applicable to any scheme where a metal contact comes into contact with a silicon or other substrate material in a semiconductor fabrication process. Accordingly, the present embodiments are to be considered as illustrative and not restrictive, and the invention is not to be limited to the details given herein, but may be modified within the scope and equivalents of the appended claims.

What is claimed is:

1. A method of forming a semiconductor device having salicided contacts, the method comprising:
   implanting a concentration of metal in a subsurface region of a substrate of a partially formed semiconductor device by exposing the substrate to a metal plasma; and
   forming salicided contacts by annealing the concentration of metal in the subsurface region of the partially formed semiconductor device.

2. The method as recited in claim 1 further comprising forming a barrier cap film on the formed concentration of metal.

3. The method as recited in claim 2 wherein the barrier cap film comprises one of TiN and Ti.

4. The method as recited in claim 1 wherein the annealing step is a Rapid Thermal Anneal process step.

5. The method as recited in claim 2 wherein the barrier cap film is formed using plasma doping equipment.

6. The method as recited in claim 1 wherein a flux of the metal plasma is adjustery at least one of DC power, RF power, pressure, and wafer bias.

7. The method as recited in claim 1 wherein the wafer bias is adjusted so that silicon is not sputtered from the substrate to a source generating the metal plasma.

8. The method as recited in claim 1 wherein the metal plasma comprises Titanium and the flux is about $6*10^{15}$ atoms*$cm^{-2}$*$sec^{-1}$.

9. The method as recited in claim 1 wherein the metal plasma comprises Cobalt and the flux is about $1*10^{15}$ atoms*$cm^{-2}$*$sec^{-1}$.

10. The method as recited in claim 1 wherein the annealing the concentration of metal in the subsurface region of the partially formed semiconductor device is an in-situ annealing step occurring simultaneously with the step of the exposing the substrate with a metal plasma.

11. The method as recited in claim 10 wherein the salicided contact formed is NiSi and the in-situ annealing step comprises heating the wafer to a temperature in the range of 250° C. to 650° C.

12. The method as recited in claim 10 wherein the salicided contact formed is $CoSi_2$ and the in-situ annealing step comprises heating the wafer to a temperature in the range of 500° C. to 850° C.

13. The method as recited in claim 10 wherein the salicided contact formed is $TiSi_2$ and the in-situ annealing step comprises heating the wafer to a temperature in the range of 750° C. to 950° C.

14. A method of forming a semiconductor device having salicided contacts the method comprising:

implanting a concentration of metal in a subsurface region of a substrate of a partially formed semiconductor device by exposing the substrate to a metal plasma; and forming salicided contacts in-situ by simultaneously annealing the concentration of metal as the metal is implanted in the subsurface region of the substrate of the partially formed semiconductor device.

15. The method as recited in claim 14 wherein the annealing of the concentration of metal simultaneously with implanting the concentration of metal comprises heating a chuck holding a wafer containing the semiconductor device.

16. The method as recited in claim 1 wherein the wafer bias is adjusted so that the implanted concentration of metal extends below the depth of substrate surface nonuniformities.

17. The method as recited in claim 1 wherein the implanted concentration of metal is approximately 1 nm in thickness.

18. The method as recited in claim 1 wherein the implanted concentration of metal extends to a depth of at least 1 nm below the surface of the substrate.

19. The method as recited in claim 1 wherein the wafer bias is adjusted to be approximately 5 watts.

20. The method as recited in claim 14 wherein the wafer bias is adjusted so that the implanted concentration of metal extends below the depth of substrate surface nonuniformities.

21. The method as recited in claim 14 wherein the implanted concentration of metal extends to a depth of at least 1 nm below the surface of the substrate.

22. The method as recited in claim 14 wherein the metal plasma has a DC power level in the range of 1 to 10 kw, an RF power level of about 1 to 10 kw, and a wafer bias of 0 to 20 watts.

* * * * *